US010647519B2

(12) United States Patent
Lim et al.

(10) Patent No.: US 10,647,519 B2
(45) Date of Patent: May 12, 2020

(54) MODULAR WORKSTATION TRANSPORT APPARATUS AND METHOD OF OPERATION

(71) Applicant: ETUAN MECHATRONIC PTE LTD, Singapore (SG)

(72) Inventors: Geck Leng Lim, Singapore (SG); Sen Lun Phan, Singapore (SG); Geck Ho Lim, Singapore (SG); Kay Yong Mok, Singapore (SG)

(73) Assignee: ETUAN MECHATRONIC PTE LTD, Singapore (SG)

( * ) Notice: Subject to any disclaimer, the term of this patent is extended or adjusted under 35 U.S.C. 154(b) by 4 days.

(21) Appl. No.: 15/561,006

(22) PCT Filed: Mar. 27, 2015

(86) PCT No.: PCT/SG2015/050051
§ 371 (c)(1),
(2) Date: Sep. 22, 2017

(87) PCT Pub. No.: WO2016/159871
PCT Pub. Date: Oct. 6, 2016

(65) Prior Publication Data
US 2018/0050873 A1    Feb. 22, 2018

(51) Int. Cl.
*B65G 37/02* (2006.01)
*B65G 15/00* (2006.01)
(Continued)

(52) U.S. Cl.
CPC ............. *B65G 37/02* (2013.01); *B65G 15/00* (2013.01); *H01L 21/67276* (2013.01); *H01L 21/67715* (2013.01); *H01L 21/67736* (2013.01)

(58) Field of Classification Search
CPC ......... B65G 37/00; B65G 37/02; B65G 43/10
See application file for complete search history.

(56) References Cited

U.S. PATENT DOCUMENTS 3,179,964 A   4/1965  Grundy
3,966,058 A * 6/1976  Heffron ................. B23Q 7/043
                                                      198/346.2

(Continued)

FOREIGN PATENT DOCUMENTS

WO         98/58402         12/1998

OTHER PUBLICATIONS

Extended European Search Report from European Patent Application No. 15887928.8 dated Oct. 16, 2018.
(Continued)

*Primary Examiner* — William R Harp
(74) *Attorney, Agent, or Firm* — Ladas & Parry, LLP

(57) ABSTRACT

A modular workstation transport apparatus is operable as one modular workstation transport apparatus in a series of modular workstation transport apparatus and includes: a first axial transport mechanism for transporting a workpiece along a first axial direction; a second axial transport mechanism for transporting the workpiece along a second axial direction; a first working area transport mechanism for transporting the workpiece between the working area and the first axial transport mechanism; and a second working area transport mechanism for transporting the workpiece between the working area and the second axial transport mechanism.

9 Claims, 13 Drawing Sheets

(51) Int. Cl.
*H01L 21/67* (2006.01)
*H01L 21/677* (2006.01)

(56) References Cited

U.S. PATENT DOCUMENTS

| | | | |
|---|---|---|---|
| 5,205,026 A | 4/1993 | Sticht | |
| 5,237,736 A * | 8/1993 | Inoue | B23Q 7/1415 198/340 |
| 5,350,295 A * | 9/1994 | Kenji | B65G 37/02 432/121 |
| 5,494,230 A * | 2/1996 | Dolgas | H02K 15/00 242/433.4 |
| 5,884,746 A | 3/1999 | Leisner et al. | |
| 6,280,134 B1 * | 8/2001 | Nering | H01L 21/67733 414/217 |
| 6,353,986 B1 * | 3/2002 | Becherucci | H02K 15/00 29/401.1 |
| 6,519,837 B1 * | 2/2003 | Ichikawa | B23P 21/004 29/720 |
| 6,761,522 B2 * | 7/2004 | Jager | B23Q 1/012 414/222.01 |
| 7,111,390 B2 * | 9/2006 | Shimamura | B81C 3/002 29/700 |
| 9,789,572 B1 * | 10/2017 | Cheung | B23P 21/004 |
| 2006/0280588 A1 | 12/2006 | Blonigan | |
| 2011/0245957 A1 | 10/2011 | Porthouse | |

OTHER PUBLICATIONS

International Search Report for PCT/SG2015/050051, dated May 21, 2015.
Written Opinion of the International Search Authority for PCT/SG2015/050051, dated May 21, 2015.
International Preliminary Report on Patentability for PCT/SG2015/050051, dated Nov. 9, 2016.

* cited by examiner

MODULAR WORKSTATION TRANSPORT APPARATUS AND METHOD OF OPERATION

CROSS REFERENCE TO RELATED APPLICATION

The present application is the U.S. national phase of PCT Application No. PCT/SG2015/050051 filed on Mar. 27, 2015, the disclosure of which is incorporated herein by reference in its entirety.

The invention relates to a modular workstation transport apparatus. The invention also relates to a series of modular workstation transport apparatus. The invention also relates to a method of transporting a workpiece using a modular workstation transport apparatus.

The invention has particular, but not exclusive application in the transportation of workpieces such as semiconductor substrates particularly in manufacturing operations such as dispensing of, say, liquids like liquid adhesives, solder paste and encapsulation resin onto the substrate.

There are various methods used in a wide variety of industries to accomplish assembly and other manufacturing processes. Automated assembly systems consisting of multiple workstations in which the assembly work is accomplished as the product (subassembly) and passed from station to station along or down the line are known. At each work station, one or more human workers may perform a portion of the total assembly work on the product. Additionally or alternatively, it is possible for a robotic system to perform a portion of the total assembly work on the product.

However, such systems have inherent problems. For instance, when the workpiece is to be moved in the line between workstations by a transportation system such as moving conveyer belts it may be necessary to provide a buffering function or station between two operation stations (workstations) which proceed at different paces. An example of such a buffering function occurs when one workstation produces intermittent output consisting of a plurality of articles while the next handling function requires a relatively steady input of single articles.

It may be desirable to arrange the individual processing and assembly tasks at the workstations so that the total time required at each workstation, or at each production line, is approximately the same, thereby to provide what is known as line balancing. In most practical situations it is very difficult to achieve perfect balance. When workstation times are unequal, the slowest station determines the overall production rate of the line. The effect of even minor improvements in throughput and the amount of manual labour involved in a final test operation can be dramatic when compared with the total manufacturing cost of the product.

Further, inflexibility in production line arrangements is highly undesirable. When manufacturing processes have to be altered, this can result in significant cost in new machinery, and production line downtime.

The invention is defined in the independent claims. Some optional features of the invention are defined in the dependent claims.

Implementation of the techniques disclosed herein may allow manufacturers to realise significant technical benefits, thereby leading to improved manufacturing processes, increased flexibility in manufacturing plant capability and reduced downtime.

The modular workstation transport apparatus has particular application in use with a workstation having machinery, such as robotic components, for performing operations on the workpiece at the station. The modular workstation transport apparatus can transport the workpiece to a working area of the modular workstation transport apparatus (or of the workstation) for operations to be conducted on the workpiece. Use of these techniques is not limited to operation with robotic machinery and, for example, the modular workstation transport apparatus can be arranged to transport the workpiece to a working area for a manual (human) operator to work thereon.

In particular, a modular workstation transport apparatus is suitable for operation as one modular workstation transport apparatus in a series of modular workstation transport apparatus, where the workstation transport apparatus is configured for operation such that, after operation at the working area of that station, the workpiece can be transported downstream to, say, another modular workstation transport apparatus in the series using a first axial transport mechanism or it can be transported upstream to, say, an upstream modular workstation transport apparatus in the series using a second axial transport mechanism.

Additionally or alternatively, when a workpiece is being transported downstream or upstream, the modular workstation transport apparatus as disclosed herein has the additional functionality in that when the workpiece is brought into the modular workstation transport apparatus, it need not necessarily be conveyed to a working area thereof, but can simply be held as "holding", awaiting transportation to another modular workstation transport apparatus for operation thereat.

In particular, because the modular workstation transport apparatus is modular, this provides enormous flexibility in line setup. For instance, consider a scenario in which the series of modular workstations (each of which may or may not have associated workstations mentioned above) are provided in a series of Station A, Station B, Station C, Station D, from downstream to upstream, and the transport apparatus is such that the workpiece is fed sequentially from Station A, through Station B, Station C to Station D with manufacturing process operations to be conducted at some or all of the stations sequentially. If it is determined that, repetition of the process operation at Station B is required after operation at Station C, then the workpiece can be transported back upstream to Station B for operation thereat.

Thus, significantly increased flexibility in the manufacturing process may be realised.

Consider another scenario in which it is determined that a new manufacturing process is required immediately after Station B and before Station C. It is possible to address this in a number of ways. One option is for the workstation tooling at that station simply to be changed out to implement the new manufacturing operations required at that station. Reconfiguration of the downstream modules can also take place accordingly. For instance, the workstation tooling that was previously at Station B can be relocated to the station previously denoted station C, and so on. A new module can be added at the end to accommodate the workstation tooling previously at Station D. In another option, a new modular workstation and modular workstation transport apparatus can be introduced as new Station B1 intermediate Stations B and C with minimal disruption. Stations C and D can simply be physically moved downstream to accommodate insertion of Station B1 intermediate Stations C and D with minimal disruption. Hitherto, it may be necessary to assemble a completely new production line to cater for the new manufacturing requirement.

Thus, implementation of the techniques disclosed herein may provide significant technical benefits in manufacturing processes, allowing hitherto unknown flexibility to addressing manufacturing issues such as catering for new processes and line balancing and the like.

In implementation of these techniques, it is possible for one of the modular workstations to be set up as a "master", and for the remaining workstations in the series to be designated as slaves, operating under control of the master station.

The capability to program the transport of the product between the work stations may be required only in the master machine, e.g. the first workstation in the series. This may result in significant savings. The main machine (Master) can be linked up with any number of secondary machines (Slaves). The programmable logic controller (PLC) mounted on the master machine communicates with the secondary/slave machines to control the routing of workpieces through the system. Each modular transport can work with another so that it can be arranged in individual, progressive or mixed individual/progressive mode.

In today's international market place, there is a school of thought in which corporations that cannot bring a new product to consumers in less time and at less cost will lose their market share. Successful corporations will be able to change their product lines quickly and inexpensively to respond to market demands as well as new product innovations. Often a major road block to achieve these goals is the difficulty of setting up the manufacturing operations, often taking a great deal of time and expense. For example, many controls must be designed specifically to be compatible with the end user's particular type of network and programming hardware. In some cases, this requires that networking wiring be installed on the conveyor at the installation site, requiring additional installation time and effort. In a given application it may be necessary in some locations to have the capability to program the controls for a given module whereas in other locations in the same application, programmable controls are not required.

Further benefits and advantages will be understood from the following discussion provided with respect to the accompanying figures in which.

Figure 1:
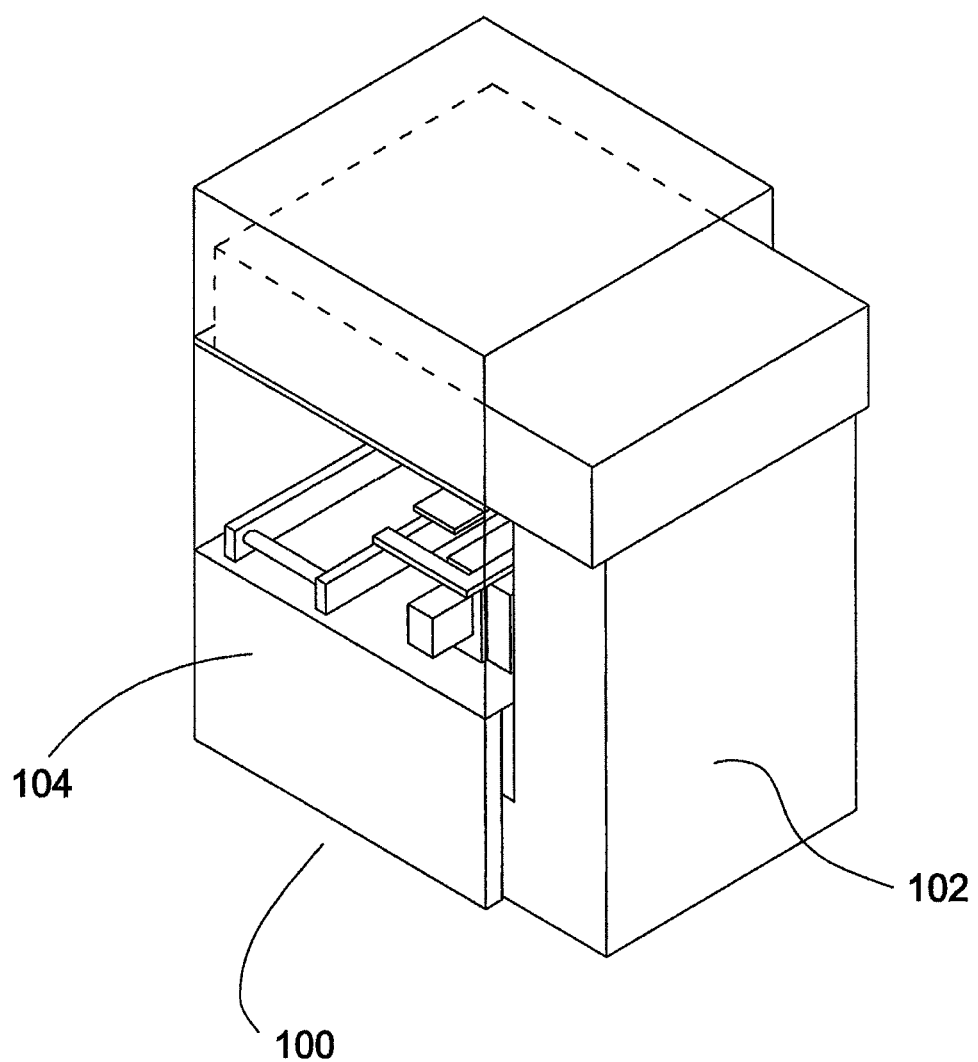
FIG. 1 is a perspective diagram illustrating a first example of a modular workstation transport apparatus installed for operation with a workstation.

Referring first to FIG. 1, a modular workstation transport apparatus 100 is illustrated in perspective view. In this example, modular workstation transport apparatus 100 is located adjacent to workstation 102. Indeed, in this example, modular workstation transport apparatus 100 and workstation 102 are designed for co-operation with one another. In this example, transport apparatus 100 and workstation 102 are separate, free-standing modules, brought together so that they may co-operate closely with one another. However, other arrangements are possible, and in one particularly useful alternative, the workstation cell is not free-standing, but arranged for mounting on or in a frame or housing of the transport apparatus 100.

Modular workstation transport apparatus 100 is configured to transport a workpiece (not shown in this figure) to a working area for machinery—such as robotic machinery components—in workstation 102 to operate on the workpiece while it is at the working area.

Modular workstation transport apparatus 100 has a housing 104 defining an internal volume or "envelope" of the modular workstation transport apparatus. Note that the housing 104 need not be made up of a single part, or of parts of identical construction. In the example of FIG. 1 housing 104 is made up at least in part of sheet metal. It may be advantageous if the housing is a full steel structure with sheet metal panel. Note also that it is not necessary for the housing 104 to enclose completely the modular workstation transport apparatus 100, and there may be one or more openings in the housing providing access to internal components, or for other purposes such as ventilation. Indeed, as will be described below, it may be possible for components of at least one of the axial transport systems to move outside of the envelope defined by the housing.

Figure 2A:
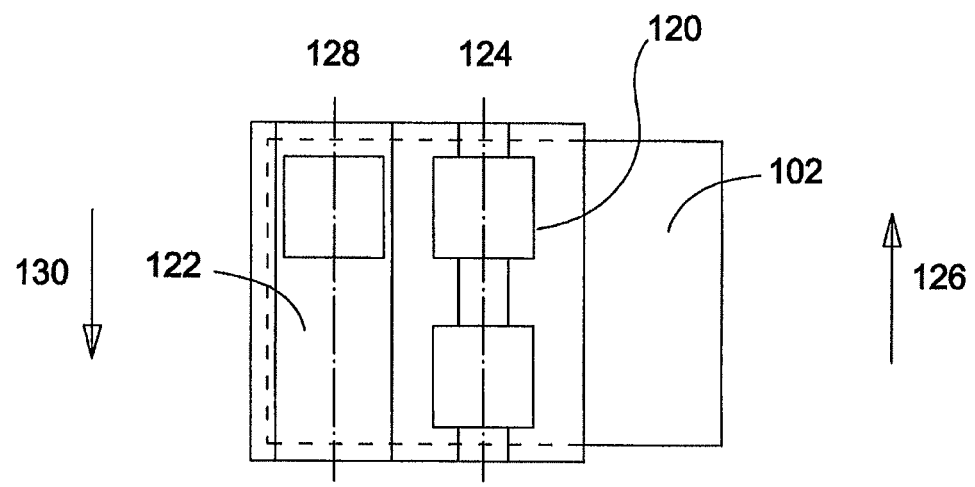
FIG. 2 is a block schematic diagram illustrating alternative views of the modular workstation transport apparatus and the workstation.
Figure 2B:
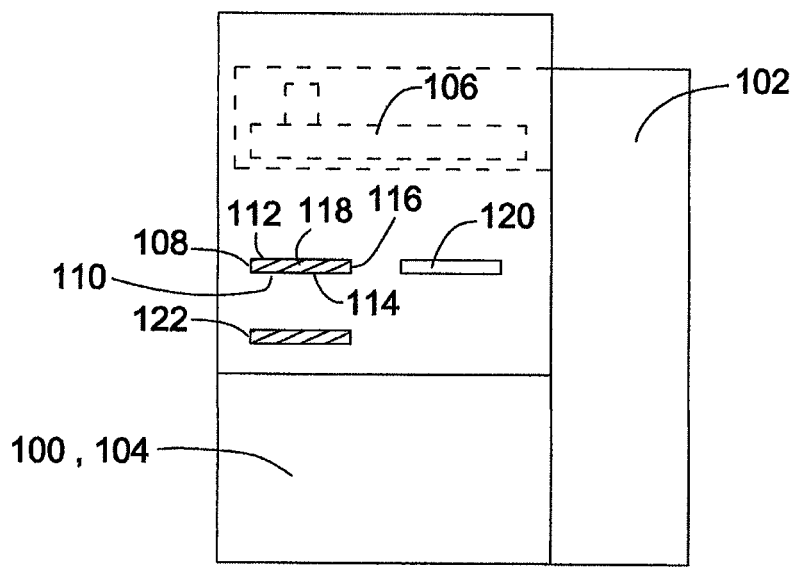

FIG. 2 provides schematic block diagrams of the modular workstation transport apparatus 100 and the workstation 102, including schematic representations of some of the internal component systems. FIG. 2A is a schematic plan view, and FIG. 2B is a schematic cross-section elevational view.

As illustrated, workstation 102 has a tooling gantry 106 for fixing of tooling components such as robotic components thereto, although these are omitted from FIG. 2 for clarity. A very diverse number of arrangements may be configured for the tooling gantry with different tooling arrangements depending on the precise manufacturing operation to be carried out using this arrangement. Workpiece 108 is illustrated at working area generally denoted 110 where the tooling components hanging from or affixed to gantry 106 may operate/work on the workpiece 108. In various configurations, the workpiece 108 may be operated on in any number of ways. For instance, components (not illustrated) may be disposed upon upper surface 112 of the workpiece by the tooling components and/or any components already positioned thereon may be operated on by the tooling components. Other types of operations on the workpiece 108 are embraced, including dispensing of liquids, such as liquid adhesives and the like.

Workpiece 108 is supported at the working area 110 on its underside 114, although the support is omitted from FIG. 2 for the sake of clarity. In this example, workpiece 108 is of generally rectangular shape having long edges 116 and short edges 118.

Modular workstation transport apparatus 100 also comprises a first axial transport mechanism 120 and a second axial transport mechanism 122. First axial transport mechanism 120 is arranged to transport workpieces being received in this example from the bottom as shown in the plan view of FIG. 2A along a first axis (or line) 124 of the apparatus in a downstream direction 126, which may be considered as a supply direction. Second axial transport mechanism 122 is arranged to transport workpieces along a second axis (or line) 128 of the apparatus in an upstream direction 130, which may be considered as a return direction. A first workpiece area transport mechanism (omitted from FIGS. 2A and 2B, but illustrated in FIG. 2C and as described in more detail with respect to FIG. 4) transports the workpiece between the first axial transport mechanism 120 and the working area 110. A second working area transport mechanism (also omitted from FIGS. 2A and 2B, but illustrated in FIG. 2C and as described in more detail with reference to FIG. 5) transports the workpiece between the second axial transport mechanism 122 and the working area 110. Thus, workpieces may be received at the modular workstation transport apparatus 100 from either the upstream or downstream direction, and transported to or from the working area 110. The workpiece can be conveyed onwards to the next modular workstation in the series of modular workstations in either the downstream or upstream direction.

Figure 2C:
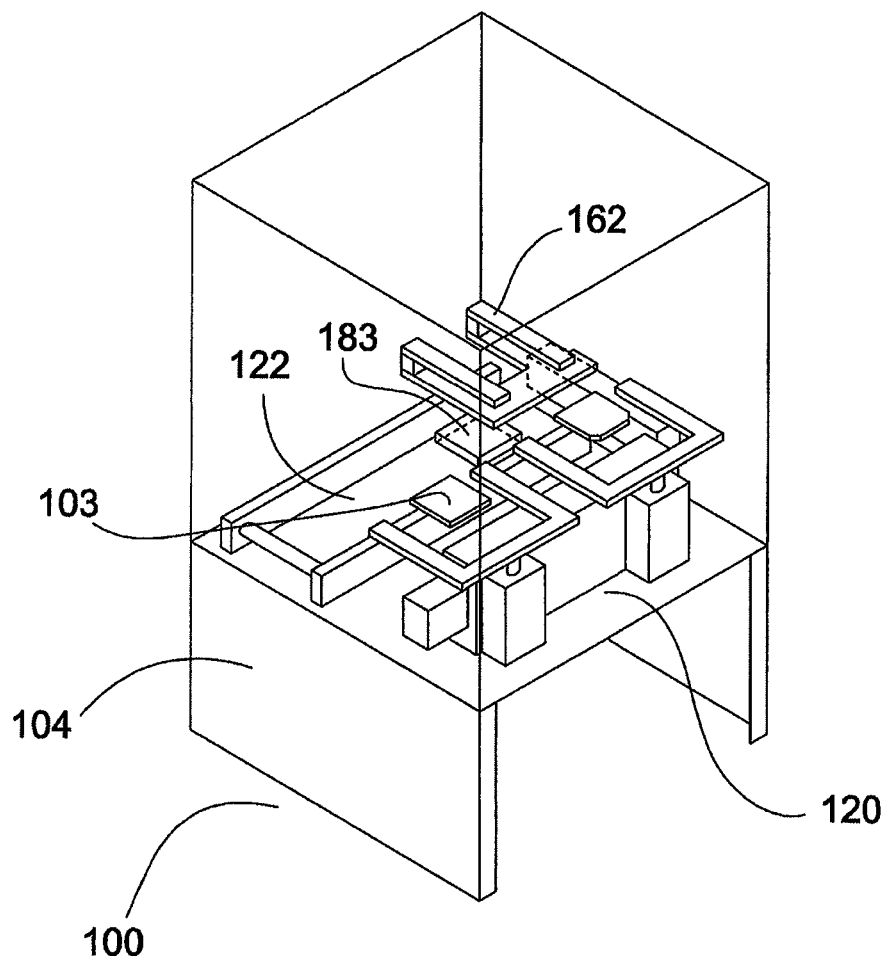

FIG. 2C illustrates a perspective view of the modular workstation transport apparatus 100 and its main components: the first axial transport mechanism 120 described in more detail with reference to FIG. 3; the second axial transport mechanism 122 described in more detail with reference to FIG. 5; the first working area transport mechanism 162 described in more detail with reference to FIG. 4; and the second working area transport mechanism 183, also described in more detail with reference to FIG. 4.

It will be appreciated that FIGS. 1 and 2 illustrate a modular workstation transport apparatus 100 (optionally operable as one modular workstation transport apparatus in a series of modular workstation transport apparatus), the modular workstation transport apparatus 100 comprising: a first axial transport mechanism 120 for transporting a workpiece 108 along a first axial direction 126. A second axial transport mechanism 122 transports the workpiece 110 along a second axial direction 130. A first working area transport mechanism 162 transports the workpiece 108 between a working area 110 and the first axial transport mechanism 120. A second working area transport 183 mechanism transports the workpiece 108 between the working area 110 and the second axial transport mechanism 122.

Note that the use of the term "axis" or "axial" is not intended to suggest that the transportation of a workpiece within the modular workstation transport apparatus 100 must be along a straight line without departure therefrom (although such arrangements are of course embraced within the current techniques), but more to indicate simply that the workpieces are intended for transportation generally in directions along the axis or axes of the apparatus.

Figure 3A:
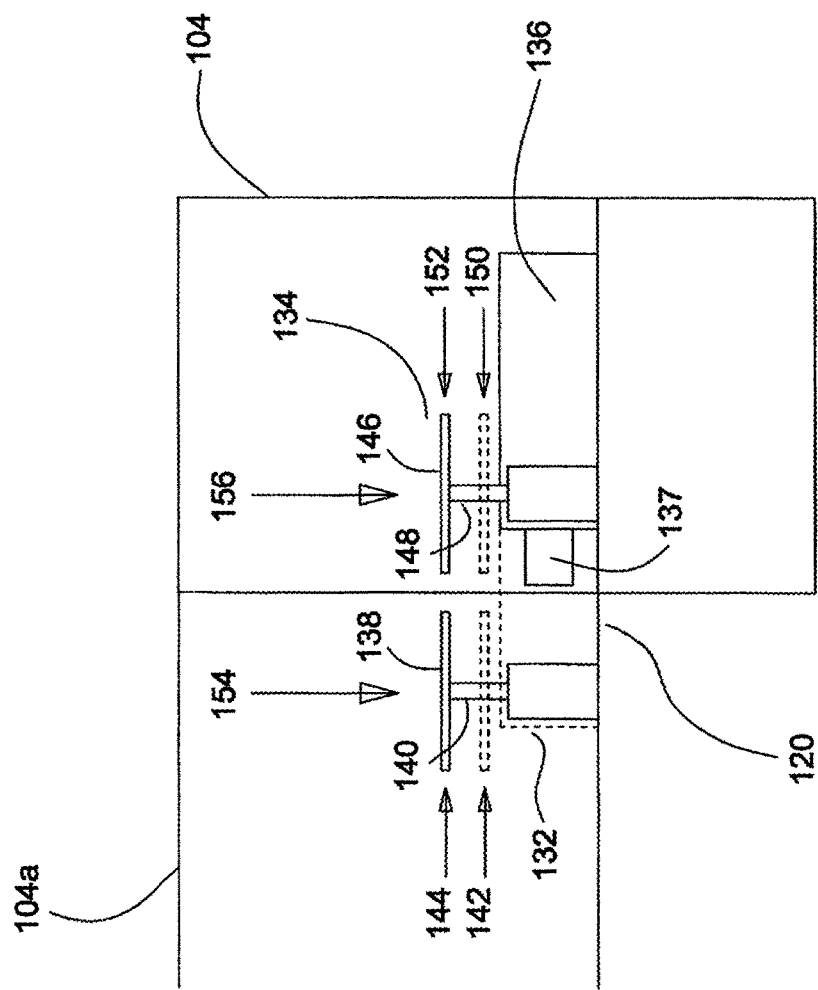
FIG. 3 is a block schematic diagram illustrating a first axial transport mechanism for a modular workstation transport apparatus 1.

FIG. 3 illustrates in more detail an exemplary first axial transport mechanism 120. Referring first to FIG. 3A, first axial transport mechanism 120 comprises a first displacement mechanism generally referred to by 132 and a second displacement mechanism generally referred to by 134. As will be described in more detail below, mechanisms 132, 134, while being part of the mechanism 120 provided to transport workpieces in axis 124, are also arranged to transport (i.e. displace) workpieces 108 into and out of the first axial transport system 120, as described in more detail with reference to FIG. 4 below.

First axial transport mechanism 120 also comprises a movable support structure 136 for the first and second displacement mechanisms moved under power of transport drive mechanism 137. In this exemplary arrangement, first and second displacement mechanisms 132, 134 are able to move simultaneously along axis 124, due to their common mounting on movable support structure 136. In this example, the drive mechanism 137 is able to drive first and second displacement mechanisms 132, 134 along both the upstream and downstream directions 126, 130 in or along axis 124, but the general flow of workpiece components using first axial transport mechanism 120 is downstream in direction 126, as illustrated in FIG. 2, although transportation of workpieces in the reverse direction 130 is also possible using first axial transport mechanism 120.

First displacement mechanism 132 comprises a first displacement platform 138 on which workpieces 108 may be disposed. First displacement mechanism 132 further comprises a first actuator mechanism 140 arranged to move first displacement platform 138 between a first proximal position 142 and a first distal position 144. The first proximal position 142 is a position closer to movable support structure 136 than the first distal position 144.

In the example of FIG. 3A, distal position 144 is a raised position and proximal position 142 is a lowered position, at a lower elevation than distal position 144.

Second displacement mechanism 134 comprises a first displacement platform 146 on which workpieces 108 may be disposed. Second displacement mechanism 134 further comprises a second actuator mechanism 148 arranged to move second displacement platform 146 between a second proximal position 150 and a second distal position 152. The second proximal position 150 is a position closer to movable support structure 136 than the second distal position 152.

In the example of FIG. 3A, distal position 152 is a raised position and proximal position 150 is a lowered position, at a lower elevation than distal position 152.

Displacement mechanisms 132, 134 may be arranged for the transfer of workpieces 108 to and/or from first working area transport mechanism 162 or a holding area or jig 103 in FIG. 2C, where it is desired for the workpiece 108 simply to be held for a time according to the specified manufacturing process as the first and second actuator mechanisms 140, 148 move platforms 138, 146 between respective proximal and distal positions, as will be described in more detail below with respect to FIG. 4.

The first axial transport mechanism 120 may be arranged such that at least part of the mechanism can be disposed (for example moved to) outside of the envelope of the modular workstation transport apparatus 100, defined by housing 104. In the example of FIG. 3A, at least part of first displacement mechanism 132 can be positioned outside of the envelope defined by the housing 104, shown at position 154. This may be realised by positioning the first axial transport mechanism 120 (e.g. under power of transport drive mechanism 137) at position 154. As such this arrangement may facilitate the receipt of workpieces 108 into the envelope of modular workstation transport apparatus 104. Second displacement mechanism 134 is positioned generally at position 156, downstream of position 154 along axis 124.

Figure 3B:
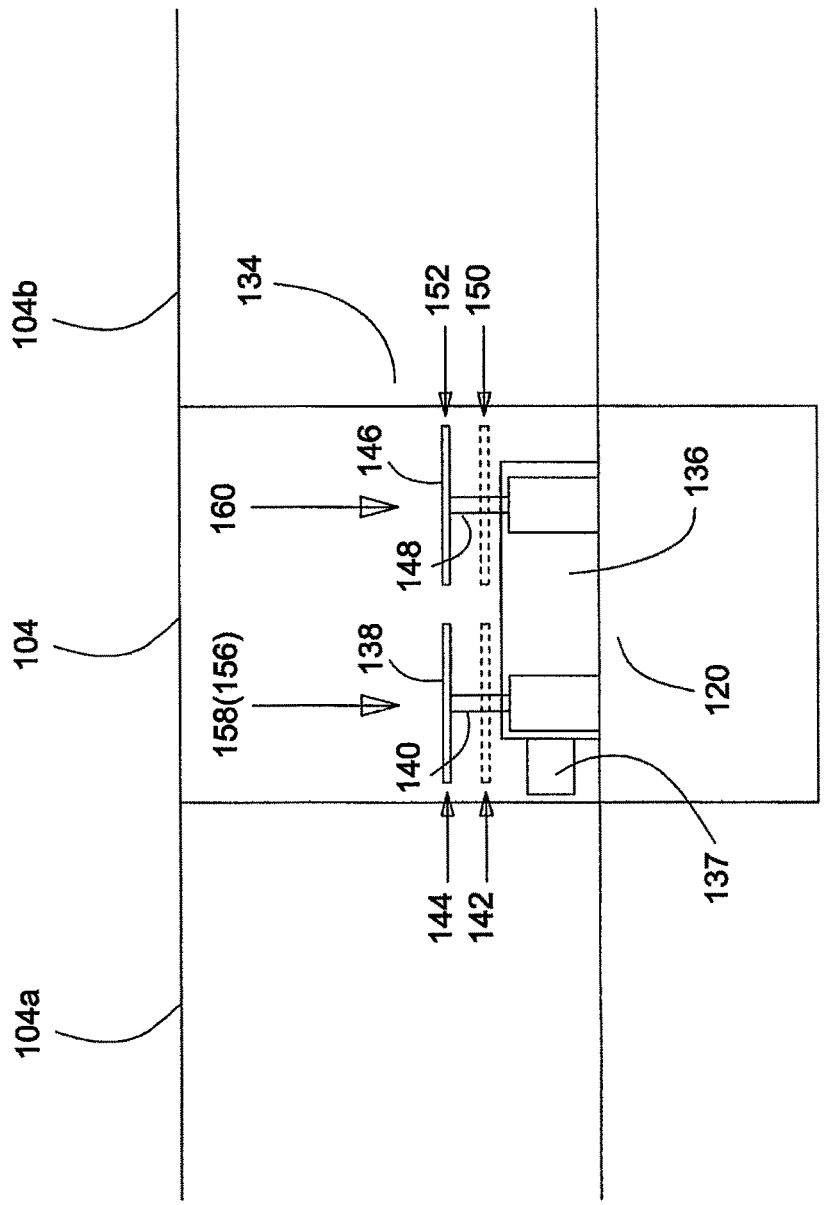

FIG. 3B illustrates another arrangement in which first displacement mechanism 132 is now disposed inside of the envelope defined by housing 104 of modular workstation transport apparatus 100. As can be seen, first axial transport mechanism 120 has been displaced (e.g. under power of transport drive mechanism 137) downstream along axis 124 so that both of the first and second displacement mechanisms 132, 134 are now disposed within the envelope defined by housing 104. Now, first displacement mechanism 132 is located at position 158 and second displacement mechanism 134 is located at position 160. Position 158 is substantially co-located (i.e. at or in the vicinity) of position 156 from FIG. 3A.

Thus, in this arrangement, modular workstation transport apparatus 100 comprises a structural envelope (defined at least in part by housing 104), and the first axial transport mechanism 120 is arranged to transport the workpiece 108 from a first position 154 outside the structural envelope to a second position 158 (156) inside the structural envelope. In an alternative arrangement, the first position 154 is inside the structural envelope and the second position 158 is outside the structural envelope.

Recalling from the above discussion that workpiece 108 can be transferred from the displacement platforms 138, 146 to, say, a holding area support 103 (illustrated in FIG. 2C), it is possible to transfer a workpiece 108 from one of the displacement platforms 138, 146 to the other by bringing the workpiece 108 to position 158 (156), transferring workpiece 108 to a holding area support temporarily, displacing first axial transport mechanism 120 along axis 124, and then transferring the workpiece to the other of the displacement platforms. Transference of workpieces 108 from platforms 138, 146 is described in more detail below with reference to FIG. 4. This may be particularly beneficial if, for example, it is desired for a workpiece to be passed from, say, Station A directly to Station C while there is an ongoing manufacturing operation at Station B. In the circumstances, the frame 162 (described in more detail with reference to FIG. 4) is positioned out of axis 124 at the working area 110. Thus, the holding area support may be brought into position to hold workpiece 108 while the platforms 138, 146 continued their operation.

Repetition of the above operation with other axial transport mechanisms in adjacent modular workstation transport apparatus 104a, allows transportation of workpieces downstream through a series of modular workstation transport apparatus. For instance, workpiece 108, having been brought to position 160 by first displacement platform 146, may then be conveyed to a downstream modular workstation apparatus 104b by an axial transport mechanism (not shown) of apparatus 104b by, say, an operation as described above with reference to FIGS. 3A and 3B where a first displacement mechanism of apparatus 104b is displaced into the envelope defined by housing 104, and co-located with position 160 for transference of the workpiece onto the first displacement platform of the mechanism.

Thus it will be appreciated that FIG. 3 illustrates a modular workstation transport apparatus 100 where the first axial transport mechanism 120 comprises a first displacement mechanism 132 comprising: a first displacement platform 138; and a first actuator mechanism 140 for moving the first displacement platform 138 between a first proximal position 142 and a first distal position 144; a second displacement mechanism 134 comprising: a second displacement platform 146; and a second actuator mechanism 148 for moving the second displacement platform 146 between a second proximal position 150 and a second distal position 152; and a transport drive mechanism 137 for driving the first displacement mechanism 132 and the second displacement mechanism 134 axially along an axis 124 of the first axial transport mechanism 100 between respective upstream 154, 156 and downstream 158, 160 positions.

It will also be appreciated that FIG. 3 illustrates a modular workstation apparatus arranged for downstream position 158 of the first displacement platform 138 to be co-located with the upstream position 156 of the second displacement platform 146.

In at least one mode of operation, the first working area transport mechanism 162 transports the workpiece 108 from the first axial transport mechanism 120 to the working area 110.

Referring to FIG. 4, this will now be described, along with a description as to how workpieces may be transferred between displacement platforms 138, 146 and the first working area transport mechanism 162. An exemplary first working area transport mechanism 162, which may be used to transport workpieces 108 between the first axial transport mechanism 120 and the working area 110, is illustrated.

Figure 4A:
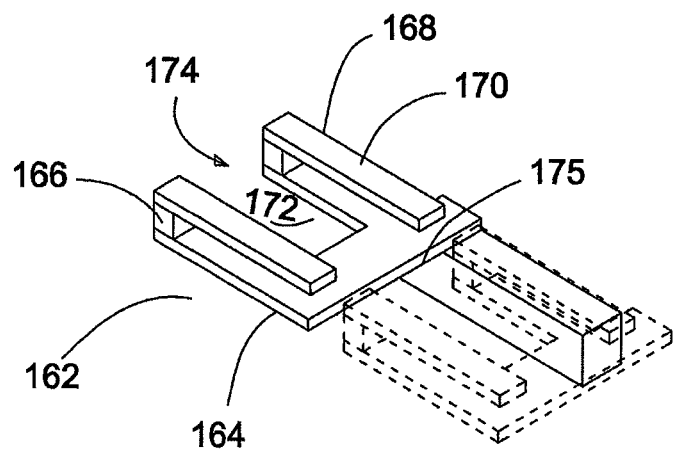
FIG. 4 is a block schematic diagram illustrating a working area transport mechanism for a modular workstation transport apparatus.

FIG. 4A illustrates a perspective view of a first working area transport mechanism 162 which comprises a lower frame 164, of generally rectangular outline, having an opening 172 on one side 174 of the frame. In this example, the opening 172 extends substantially across the breadth of the frame 164 almost to opposite side 175 of the frame, so that the frame, taking into account the opening, is of a generally C-shape when viewed in plan. Projecting from an upper surface of the frame 164, is at least one vertical support member 166. In the example of FIG. 4, two vertical support members 166 are provided, one on either side of the opening 172. One or more horizontal support members 168 extend from an upper part of the or each vertical sup port member 166, extending horizontally and generally parallel to the upper surface of the lower frame 164.

The horizontal support member(s) 168 comprise one or more flat surface 170 on which a workpiece 108 may rest or be disposed.

Figure 4B:
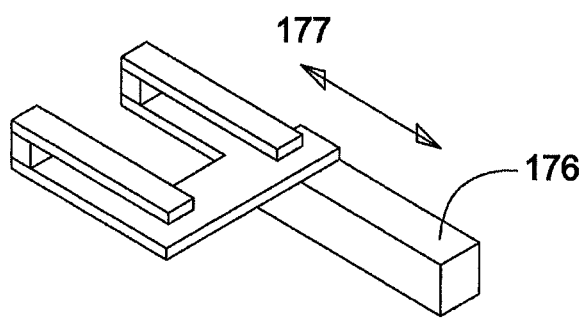
Figure 4C:
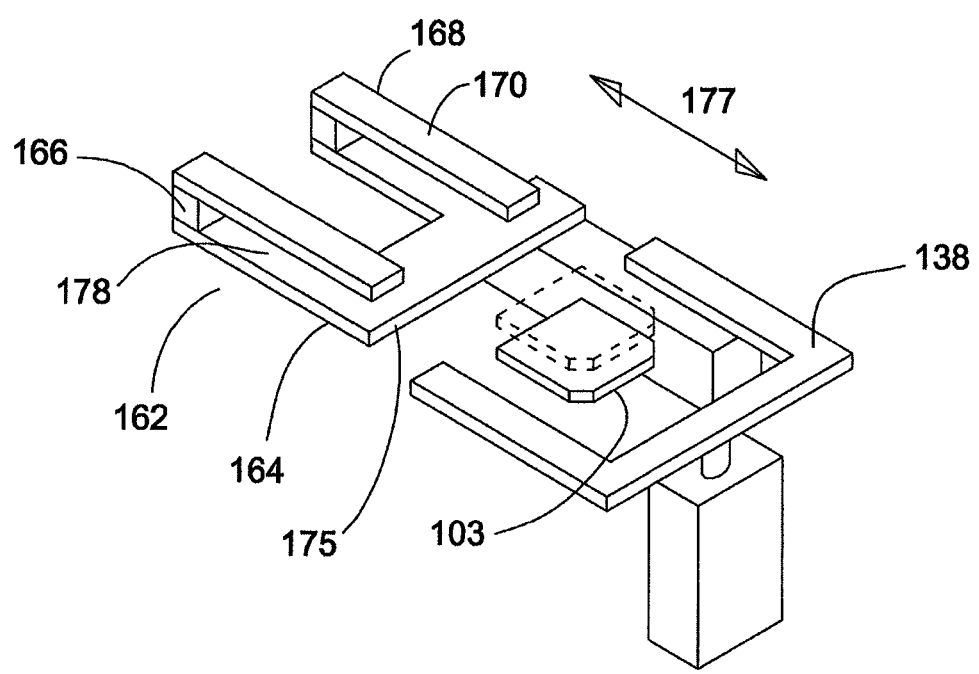

FIG. 4B provides another perspective view of the first working area transport mechanism 162 including a driver mechanism 176 for providing the necessary displacement in directions 177. In this example, direction 177 is a lateral or generally lateral direction, lateral relative to axes 124, 128 of FIG. 2. A displaced first working area transport mechanism 162 is illustrated in dashed lines in FIG. 4A. As mentioned above, one or more horizontal support members 168 extend horizontally from the or each vertical support member 166 generally parallel to an upper surface of frame 164. As shown in FIG. 4C, the spacing between the horizontal support members 168 and the upper surface of the support frame 164 defines a space (or volume) 178, and this facilitates transference of workpieces 108 between the first axial transport mechanism 120 and the first working area transport mechanism 162.

Referring again to FIG. 3, it will be remembered that first and second displacement mechanisms 132, 134 each respectively comprise displacement platforms 138, 146.

In a first scenario of transferring a workpiece 108 from a platform 138 (although this equally applies for platform 146) of the first axial transport mechanism 120 to first working area transport mechanism 162, first working area transport mechanism is positioned generally in or adjacent to axis 124. First axial transport mechanism 120 is displaced downstream, as described above, so that platform 138 moves downstream in direction 126 along axis 124 and with platform 138 in the raised, distal position 144. In displacing the first axial transport mechanism 120 thus, the platform 136 and the workpiece 108 disposed thereon are situated adjacent to working area transport mechanism 162 which, by now, has been displaced to the position indicated by the dashed lines in FIG. 4A (although it will be appreciated that it is not essential that the coordination of movement of the components is as described in this sequence). In this example, the platform 138 is positioned adjacent (co-located with) frame 164. First actuator mechanism 140 is operated to move platform 138 from the distal position 144 towards proximal position 142.

In this example, the workpiece 108 is positioned on platform 138 so that a part of workpiece 108 overhangs an edge of platform 138 near the or each horizontal support member 168. In one particularly useful arrangement, the surface area of platform 138 is less (for example, significantly less) than the surface area of underside 114 of workpiece 108. The horizontal support members 168 may also extend significantly beyond the side 175 of frame 164. Therefore, as platform 138 moves from distal position 144 to proximal position 142 (the platform is lowered in this example) the underside 114 of workpiece 108 comes to rest on the upper surface(s) 170 of horizontal support members 168. Platform 138—without workpiece 108—continues to be lowered towards proximal position 142. Platform 138 is disposed generally adjacent the space/volume 178 between the horizontal support members 168 and frame 164. Transport drive mechanism 137 may thereafter operate to move platform 138 back upstream towards position 154 (while platform 138 is held stationery in the vertical plane in the proximal position 142) through volume 178 without clashing with working area transport mechanism 162, specifically frame 164 or the horizontal support members 168.

Once workpiece 108 is disposed on upper surface(s) 170 of horizontal support members 168, the drive mechanism 176 operates to move frame 164 and the workpiece 108 disposed thereon along axis 177 towards working area 110.

If it is desired to move workpiece 108 from working area 110 back to the first axial transport mechanism 120, a reverse operation as described above may be executed.

In addition to being able to transport workpieces to/from the first working area transport mechanism, the first and second displacement mechanisms 132, 134 may additionally or alternatively be configured to transport workpieces to/from a holding area, such as a support frame or jig 103 thereat, in a similar manner. The transfer to/from the holding area support frame 103 can take place while the displacement platforms 138, 146 are at their respective proximal and distal positions, or during transitions between these positions. Holding area support frame 103 is movable between first and second positions indicated by the frame being shown in solid and in dashed lines in FIG. 4C.

As also mentioned above, modular workstation transport apparatus 100 also comprises a second working area transport mechanism for transporting the workpiece between the working area 110 and the second axial transport mechanism 122. An exemplary second working area transport mechanism 183 is illustrated in FIG. 5. Also illustrated in this figure, is one exemplary second axial transport mechanism 122 comprising a first conveyor 180 and a second conveyor 182. First and second conveyors 180, 182 comprise, in this example, narrow conveyor belts arranged to transport workpieces 108 along axis 128. Conveyors 180, 182 are arranged to travel at least in upstream direction 130 of axis 128 (refer again to FIG. 2), but may also be able to convey in a direction opposite direction 130, should that be desired.

With reference to the example of FIG. 2, second axial transport mechanism 122 is shown disposed generally below working area 110. Therefore, in this example, second working area transport mechanism works generally in a vertical orientation for moving workpieces 108 between working area 110 and the second axial transport mechanism 122. As a minimum, the second working area transport mechanism may be arranged to transport workpieces from working area 110 to the second axial transport mechanism 122.

However, in addition to the vertically-oriented second working area transport mechanism described above, it will be appreciated that other arrangements are encompassed, and that it is not a prerequisite that the second axial transport mechanism 122 be disposed beneath working area 110 or that the second workplace area transport mechanism operates in a vertical orientation. It will also be appreciated, should it be necessary, that it is possible to transport workpieces 108 from the second axial transport mechanism 122 to working area 110.

Second working area transport mechanism comprises a displacement platform 184 and a third actuator mechanism 186. The third actuator mechanism 186 is configured to move third displacement platform 184 between third distal position 188 for third displacement platform 184 and third proximal position 190 for third displacement platform 184. The third proximal position 190 is a position closer to a support structure (not shown) for actuator mechanism 186 than the third distal position 188.

The second working area transport mechanism 183 is, in this example, arranged for the transfer of workpieces 108 to/from second axial transport mechanism 122 (comprising first and second conveyor 180, 182) as the third actuator mechanism 186 moves third displacement platform 184 between third distal position 188 and third proximal position 190.

Generally speaking, third displacement platform 184 may be sized so that its cross-sectional area is less (for example significantly less) than the area of workpiece 108. Also, platform 184 may be sized such that it is able to fit in opening 172 of the frame 164 illustrated in FIG. 4A. Moreover, as also seen in FIG. 5a width of third displacement platform 184 is less than the distance between the gap between first and second conveyors 180 182. Thus, and recalling from FIG. 2 that the second axial transport mechanism 122 may be disposed below working area 110, third displacement platform 184 may be positioned under working area 110, extending through opening 172 and pushing up a short distance to lift workpiece 108 off upper surface(s) 170 of the one or more horizontal support members 168. Drive mechanism 176 for the first working area transport mechanism 162 is operated to withdraw the frame along direction 177 away from third displacement platform 184, until clear from the footprint of the workpiece 108. Once clearance is achieved, the third displacement platform 184, with workpiece 180 thereon, may be lowered from third distal position 188 towards third proximal position 190. Operation of actuator mechanism 186 downwards continues, until third displacement platform 184 is brought below the level of the conveyors 180, 182. Workpiece 108 may then be disposed on conveyors 180, 182 for transportation along upstream axis 128 in direction 130.

Should it be desired to move a workpiece 108 from the conveyors 180, 182 to the working area 110, the operation as described above can simply be reversed.

Second axial transport mechanism 120 be provided with a stopper (not shown) at or near the end of one conveyor module to stop the workpiece moving to the next modular transport workstation if the second axial transport mechanism of the upstream modular transport workstation is in operation.

Figure 5:
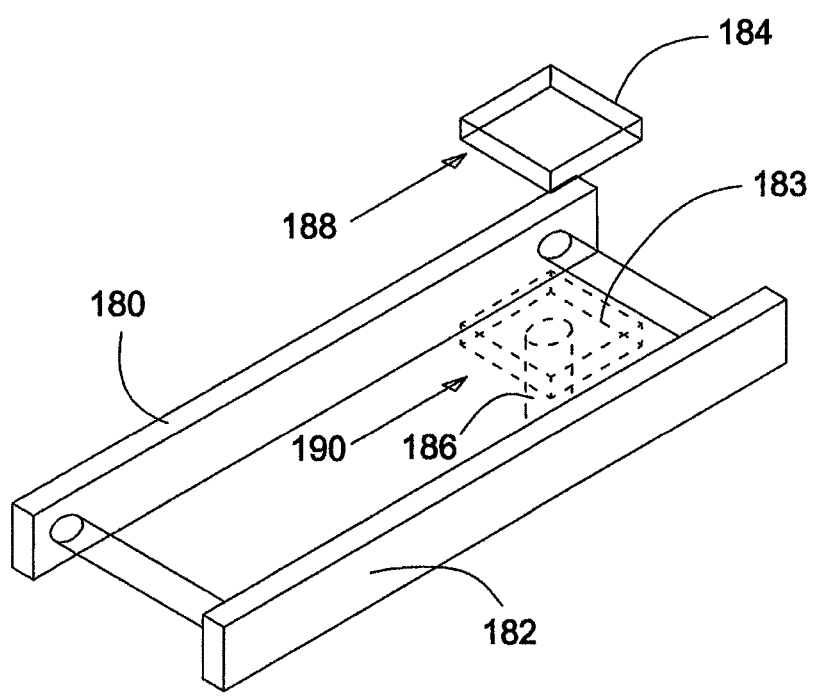
FIG. 5 is a block schematic diagram illustrating a second working area transport mechanism operating in conjunction with a second axial transport mechanism.

Therefore it will be appreciated that FIG. 5 illustrates a modular workstation transport apparatus 100 further comprising a third displacement mechanism comprising a third displacement platform 184 and a third actuator mechanism 186 for moving the third displacement platform 184 between a third proximal position 190 and the third distal position 188 for transporting the workpiece 108 between the working area 110 and the second axial transport mechanism 124

Use of these modular transportation systems may give tremendous benefits in manufacturing, as mentioned above, providing flexible and scalable layout options.

The system may be easily re-configured, where workstations can be added for scaling up the capacity. This can be done by simply adding one or more workstations at the end of the series of modular workstations, or inserting a new workstation in between two existing workstations. And of course, the reverse installation operation(s) can be conducted when scaling down capacity. Moreover, it is possible for a workstation to switch easily over to a different operating mode.

It has been found particularly beneficial that one master unit operating on PLC control for the first axial transport mechanism controls up to 12 slave modules in one line with one master module and two slave modules. So in this exemplary arrangement for a total of 12 modules, there may be provided four master modules and 8 slave modules.

Figure 6A:
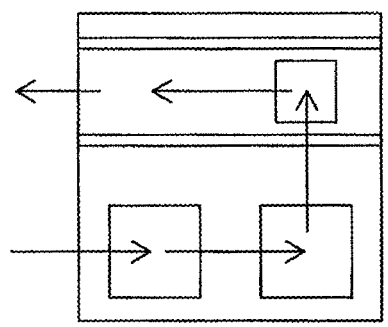
FIG. 6 is a series of layout diagrams illustrating different modes of operation of the series of modular workstation transport apparatus.

At least four modes of operation are contemplated. A first of these is stand-alone mode illustrated in FIG. 6A, where a workpiece is received at a transport mechanism, and conveyed to the working area as described above, then transported back upstream as also described above.

Figure 6B:
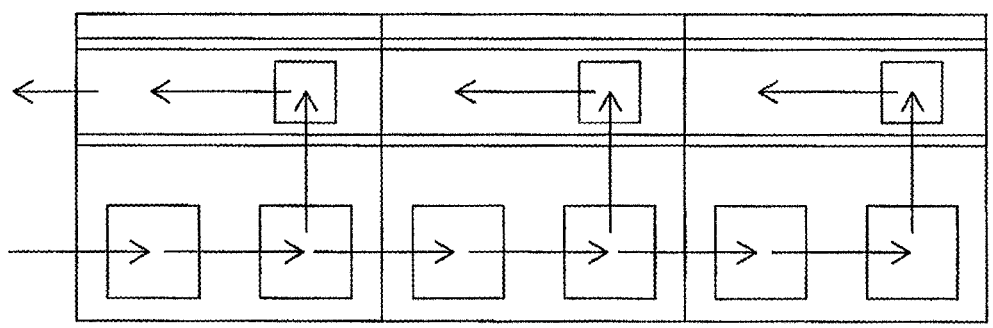

When modular transportation systems are combined in series with one another, there are at least a further three modes of operation. In an "individual" mode of operation as illustrated in FIG. 6B, a workpiece may be brought into a first modular workstation transport apparatus, again as described above with reference to FIG. 3. The first workstation is performing its manufacturing process, the first axial transport mechanism conveys a second workpiece to the second workstation for manufacturing thereat and, also, a third workpiece to the third workstation for manufacturing thereat. Once the respective manufacturing operations have been completed at the first, second and third workstations, the workpieces are conveyed back upstream.

Figure 6C:
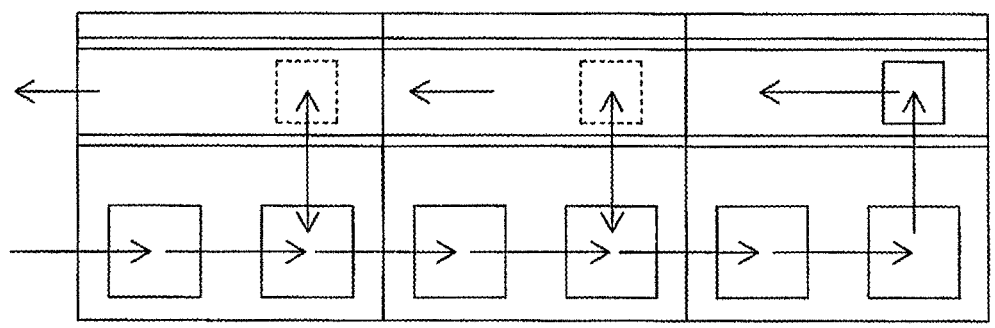

In a "progressive" mode of operation as illustrated in FIG. 6C, a workpiece is brought into the working area of the first workstation. Thereafter, the workpiece is returned to the first axial transport mechanism for transportation to the second workstation, for the manufacturing operation to be carried out at that station. After having been operated on at the working area of the second workstation, the workpiece is conveyed back to the first axial transport mechanism for transportation to the third workstation. After the process is completed at the third workstation, the workpiece is transported to the second axial transport mechanism for returning back upstream.

Figure 6D:
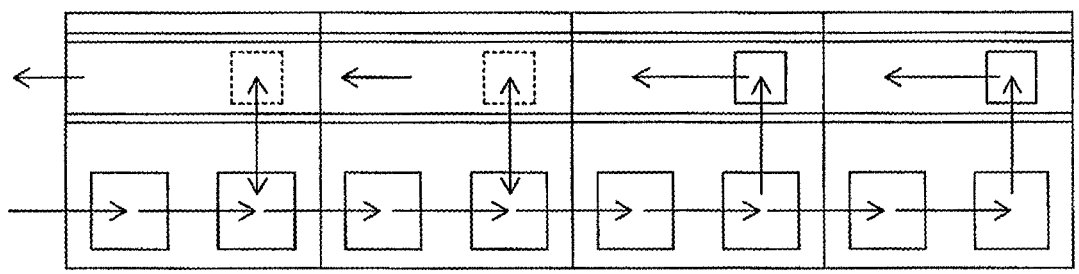
Figure 6E:
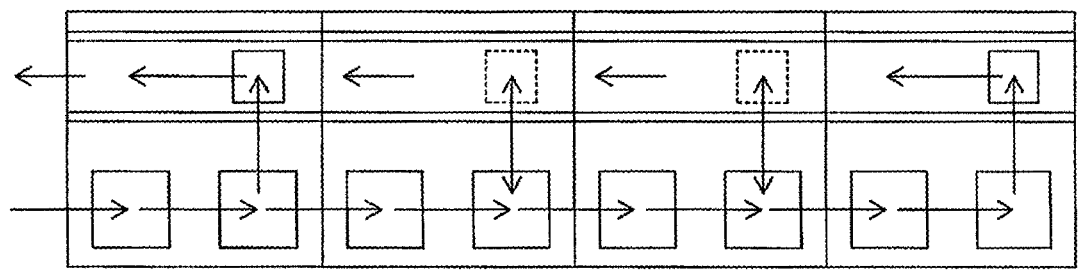

Two combined or hybrid individual plus progressive modes of operation are also contemplated, as illustrated in FIGS. 6D and 6E. Looking first at FIG. 6D, this is a progressive—progressive—individual—individual sequence of operation. After the process is completed at the first workstation, the workpiece is returned back to the first axial transport mechanism for transportation to the second workstation, for manufacturing operations to be conducted thereat. After the process is completed at the second workstation, the workstation is transported to the third workstation or the fourth workstation using the first axial transport mechanism. Each of the third and fourth workstations operate in the individual mode of operation so that when workpieces have been operated on at the stations, the workpieces are conveyed back to the second axial transport mechanism by the respective second working area transport mechanisms of the third and fourth workstations.

An individual—progressive—progressive—individual mode of operation is illustrated in FIG. 6E. While the first workstation is completing its process, the first axial transport mechanism can continue to supply a workpiece to the second workstation. After the first workstation has completed its process, that workpiece is conveyed to the second axial transport mechanism for transporting back upstream. After the process is completed at the second workstation, the workpiece is transported downstream using the first axial transport mechanism, to the third workstation for operation thereat and then onto the fourth workstation, also for operation thereat. After the fourth workstation has completed its process, the workpiece is conveyed back to the second axial transport mechanism for transportation back upstream.

A major contributing factor to the flexibility provided is that there are two exits from the working area 110—a first one back to the first axial transport mechanism for further transfer downstream, and the second one on to the second axial transport mechanism 122 for transfer back upstream— the workpiece 108 can be transferred back upstream at any one of the modular workstation transport apparatus 100 in the series.

It will be appreciated that the specific example given above for the various transportation mechanisms are exemplary only, and that many other arrangements may also be possible. For example, instead of the mechanism described above for first axial transport mechanism, a simple conveyor system could be used instead. Further, instead of the mechanism described above for the first working area transport mechanism 162, other types of transportation mechanisms including those arranged to "pick and place" workpieces— lifting them, displacing them in a desired direction, and then lowering them to the desired position—may be used.

Figure 7:
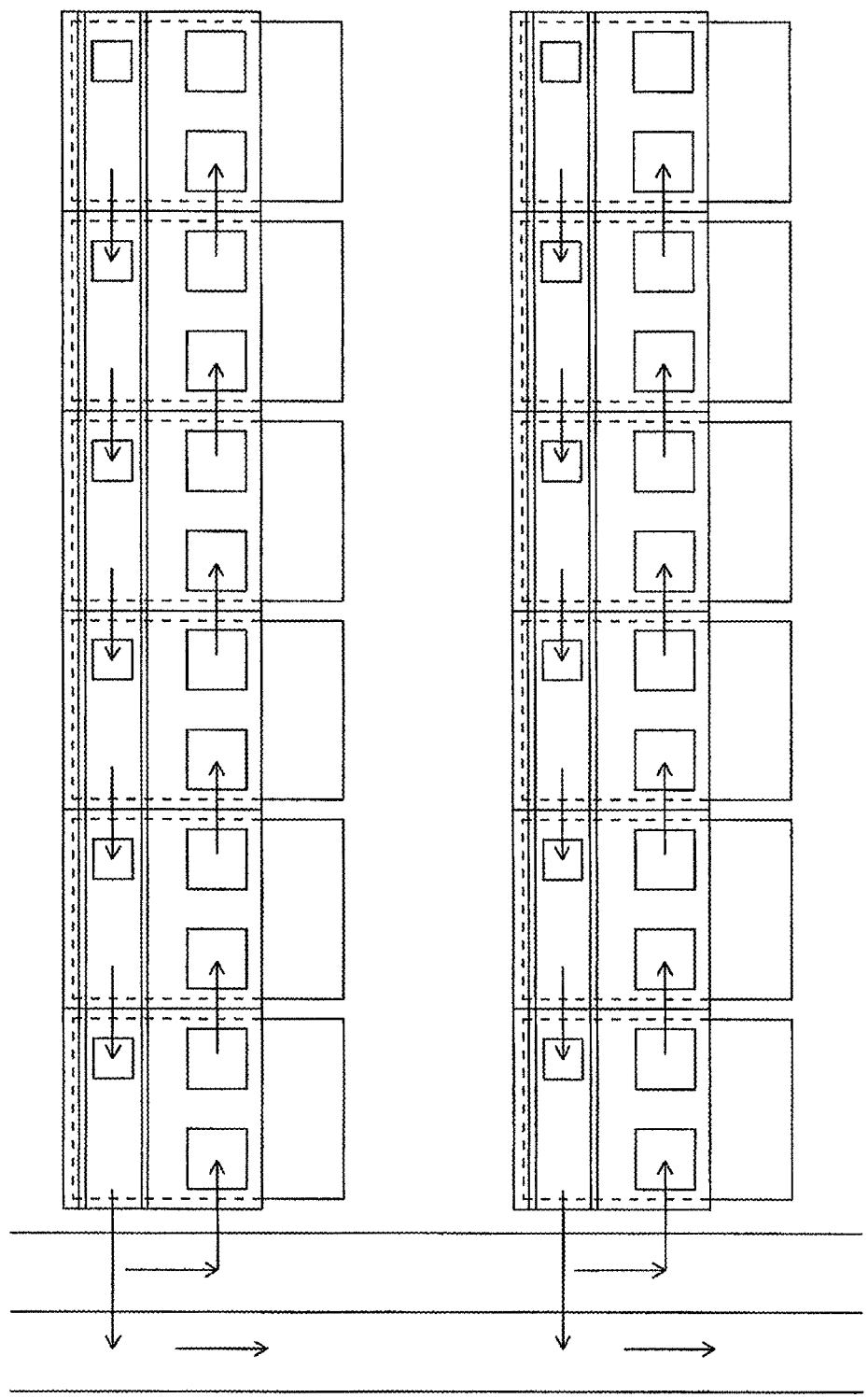
FIG. 7 is a layout diagram illustrating series of modular workstation transport apparatus installed for operation with workstations in a "horizontal" layout.

FIG. 7 is a layout diagram illustrating series of modular workstation transport apparatus installed for operation with workstations in a "horizontal" layout, with workpieces being supplied in from an infeed conveyor, down through a first series of workstations/transport apparatus in progressive mode, then backup to the infeed conveyor, before the workpieces are then transported down to another series of workstations/transport apparatus, also for operation in progressive mode thereat.

Figure 8:
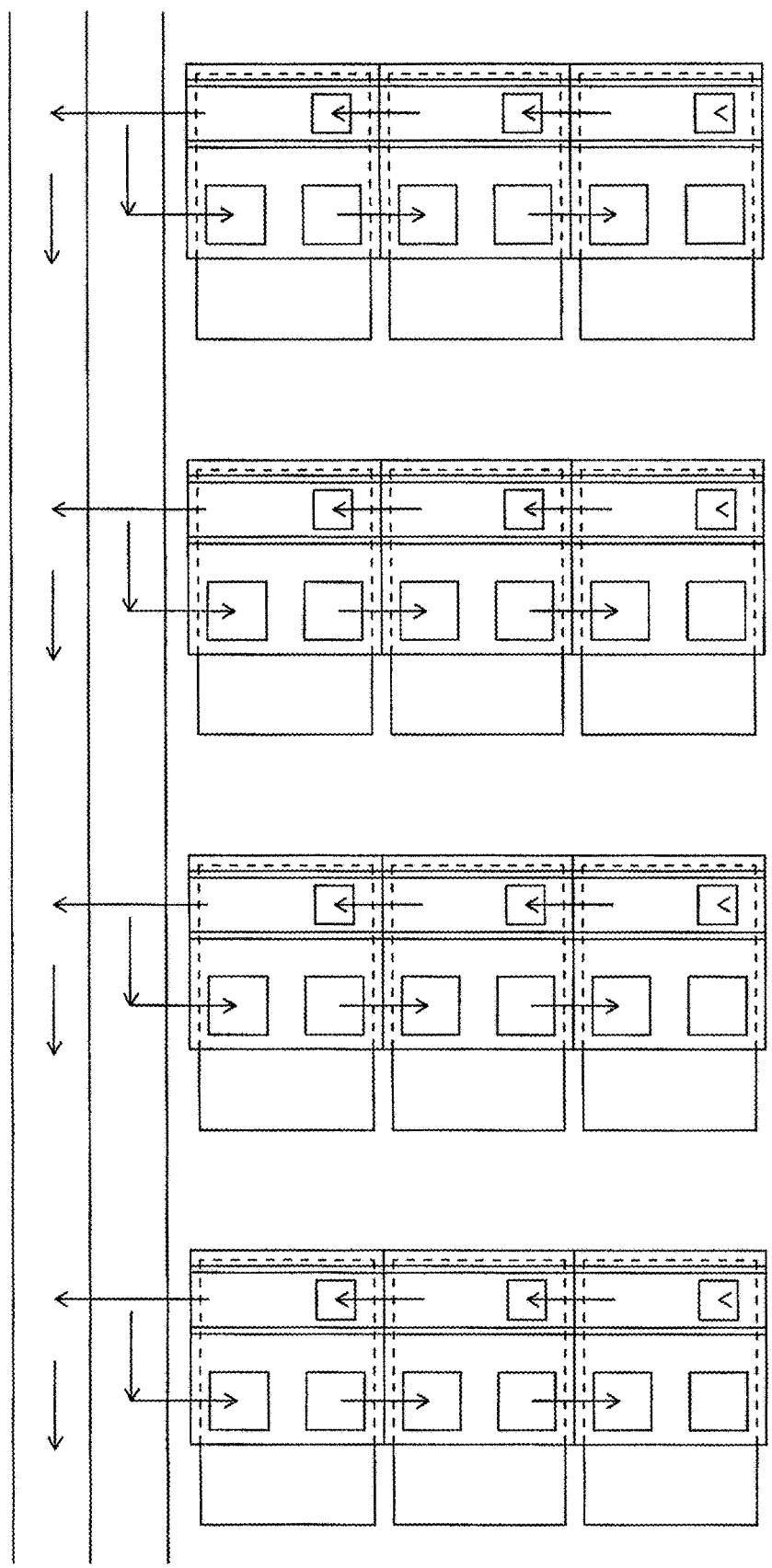
FIG. 8 is a layout diagram illustrating series of modular workstation transport apparatus install for operation with workstations in a "vertical" layout.

FIG. 8 is a layout diagram illustrating series of modular workstation transport apparatus installed for operation with workstations in a "vertical" layout, with workpieces being supplied in from an infeed conveyor, down through a first series of workstations/transport apparatus in progressive mode, then backup to the infeed conveyor, before the workpieces are then transported down to second, third and fourth series of workstations/transport apparatus, also for operation in progressive mode thereat.

Figure 9:
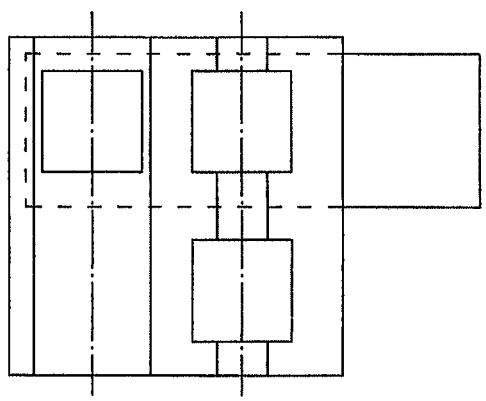
FIG. 9 is a layout diagram illustrating different layout configurations for operation on the workpieces.
Figure 9:
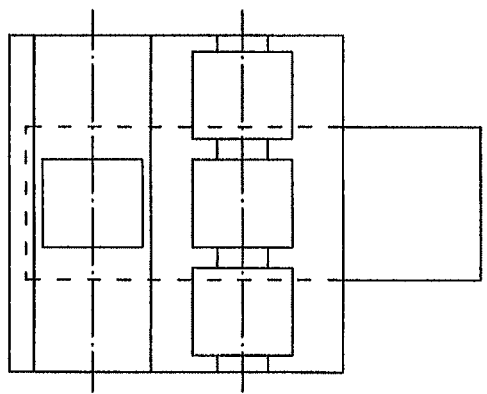
Figure 9:
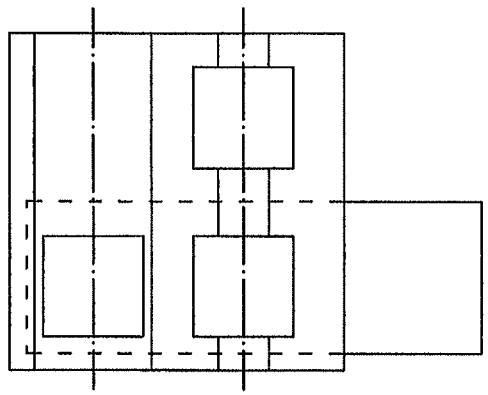

FIG. 9 illustrates the flexibility in arranging the dock in position for the workstation with the modular workstation transport apparatus. In this figure, a number of different arrangements are shown. At the left-hand side, the dock in position for the workstation is shown on the left-hand side, and the modular workstation transport apparatus has two "pallet positions", which provide two positions which may be used as working area areas 110. In the middle arrangement, the dock in position for the workstation is shown in the centre, and the modular workstation transport apparatus has three pallet positions, providing three positions which may be used as working area areas 110. In the arrangement shown on the right hand side, the dock in position for the workstation is shown at the right hand side, and modular workstation transport apparatus also has two pallet positions.

It will be appreciated that the invention has been described by way of example only and that a variety of alternative approaches may be adopted without departing from the scope of the invention, as defined by the appended claims.

The invention claimed is:

1. A modular workstation transport apparatus operable as one modular workstation transport apparatus in a series of modular workstation transport apparatus, the modular workstation transport apparatus comprising:
   a first axial transport mechanism for transporting a workpiece along a first axial direction;
   a second axial transport mechanism for transporting the workpiece along a second axial direction;
   a working area configured for performing a manufacturing process on the workpiece;
   a first working area transport mechanism for transporting the workpiece between the first axial transport mechanism and the working area; and
   a second working area transport mechanism for transporting the workpiece between the working area and the second axial transport mechanism;
   wherein the first working area transport mechanism is operable to transport the workpiece from the first axial transport mechanism to the working area and wherein the apparatus provides first and second exits from the working area, a first exit back to the first axial transport mechanism and a second exit to the second axial transport mechanism; and wherein
   the first working area transport mechanism is further operable to transport the workpiece back from the working area to the first axial transport mechanism.

2. The modular workstation transport apparatus of claim 1, wherein at least one of the working area transport mechanisms is arranged to move workpieces between the working area and a respective axial transport mechanism, the working area being vertically disposed with respect to said axial transport mechanism.

3. The modular workstation transport apparatus of claim 1, wherein the modular workstation transport apparatus comprises a structural envelope and the first axial transport mechanism is arranged to transport the workpiece from a first position outside the structural envelope to a second position inside the structural envelope.

4. The modular workstation transport apparatus of claim 1, wherein the first axial transport mechanism comprises:
   a first displacement mechanism comprising:
      a first displacement platform; and
      a first actuator mechanism for moving the first displacement platform between a first proximal position and a first distal position;
   a second displacement mechanism comprising:
      a second displacement platform; and
      a second actuator mechanism for moving the second displacement platform between a second proximal position and a second distal position; and
   a transport drive mechanism for driving the first displacement mechanism and the second displacement mechanism axially along an axis of the first axial transport mechanism between respective upstream and downstream positions.

5. The modular workstation transport apparatus of claim 4, arranged for the downstream position of the first displacement platform to be co-located with the upstream position of the second displacement platform.

6. The modular workstation transport apparatus of claim 4, further comprising a third displacement mechanism comprising:
   a third displacement platform; and
   a third actuator mechanism for moving the third displacement platform between a third proximal position and a third distal position, for transporting the workpiece between the working area and the second axial transport mechanism.

7. The modular workstation transport apparatus of claim 1, wherein the first working area transport mechanism is configured to transport the workpiece from the first axial transport mechanism to the working area.

8. A series of modular workstation transport apparatus comprising a plurality of modular workstations transport apparatus according to claim 1.

9. A method of operation of a modular workstation transport apparatus operable as one modular workstation transport apparatus in a series of modular workstation transport apparatus, the modular workstation transport apparatus comprising:
   a first axial transport mechanism for transporting a workpiece along a first axial direction;
   a second axial transport mechanism for transporting the workpiece along a second axial direction;
   a working area configured for performing a manufacturing process on the workpiece;
   a first working area transport mechanism for transporting the workpiece between the first axial transport mechanism and the working area; and
   a second working area transport mechanism for transporting the workpiece between the working area and the second axial transport mechanism;
   wherein the first working area transport mechanism is operable to transport the workpiece from the first axial transport mechanism to the working area and wherein the apparatus provides first and second exits from the working area, a first exit back to the first axial transport mechanism and a second exit to the second axial transport mechanism; and wherein the method comprises:
   transporting, by the first working area transport mechanism, the workpiece from the first axial transport mechanism to the working area; and
   transporting, by the first working area transport mechanism, the workpiece back through the first exit from the working area to the first axial transport mechanism.

* * * * *